US010831179B2

(12) United States Patent
Byers et al.

(10) Patent No.: US 10,831,179 B2
(45) Date of Patent: Nov. 10, 2020

(54) SYSTEMS AND METHODS FOR GENERATING PMI ASSOCIATION AMONG FEATURES ON A MACHINE PART OF A MODEL

(71) Applicant: General Electric Company, Schenectady, NY (US)

(72) Inventors: Jason Anton Byers, Greenville, SC (US); Alexandria Stoker Cochrane, Greenville, SC (US); Brian Christopher Wheeler, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 235 days.

(21) Appl. No.: 15/460,669

(22) Filed: Mar. 16, 2017

(65) Prior Publication Data

US 2018/0268536 A1 Sep. 20, 2018

(51) Int. Cl.
*G06F 17/50* (2006.01)
*G05B 19/4097* (2006.01)

(52) U.S. Cl.
CPC ......... *G05B 19/4097* (2013.01); *G06F 17/50* (2013.01); *G05B 2219/35134* (2013.01); *Y02P 90/265* (2015.11)

(58) Field of Classification Search
CPC ......... G06T 7/0004; G06T 2207/30164; G06T 2200/24; G06T 7/90; G06T 2219/004;
(Continued)

(56) References Cited

U.S. PATENT DOCUMENTS

2009/0213116 A1 8/2009 Konev et al.
2011/0098983 A1* 4/2011 Staples .................. G06F 17/50
703/1
(Continued)

FOREIGN PATENT DOCUMENTS

CN 105354353 A 2/2016
CN 103679817 B 8/2016
WO 2016018264 A1 2/2016

OTHER PUBLICATIONS

Siemens NX10—Product and Manufacturing Information, Published Feb. 6, 2016 https://www.youtube.com/watch?v=SN-kXW3p5wM (Year: 2016).*
(Continued)

*Primary Examiner* — Jeanette J Parker
(74) *Attorney, Agent, or Firm* — Fletcher Yoder, P.C.

(57) ABSTRACT

A system includes a processor for implementing a computer-aided technology (CAx) system, the CAx system including a graphical-user-interface (GUI) that presents a computer-aided design (CAD) model, and the CAD model includes at least one part. Furthermore, the system includes memory storing instructions that cause the processor to present the GUI, receive, via the GUI, at least one indication of an association type and an indication of at least one criteria corresponding to the at least one indication of the association type, iterate the model to identify at least one second feature that satisfies the association type and the criteria, associate and store product and manufacturing information (PMI) with the at least one second feature, generating a PMI association, and display a PMI object of the at least one second feature on the CAD model in the GUI, the PMI object including the PMI.

20 Claims, 11 Drawing Sheets

(58) Field of Classification Search
CPC .. G06F 3/04815; G06F 17/50; G06F 3/04842; G06F 3/048; G05B 19/4097; G05B 2219/35134
See application file for complete search history.

(56) References Cited

U.S. PATENT DOCUMENTS

2013/0151551 A1* 6/2013 Chow ................... G06T 9/00
                                                          707/769
2015/0347366 A1   12/2015 Irwin
2016/0314341 A1* 10/2016 Maranzana ............ G06F 17/50

OTHER PUBLICATIONS

Solidworks MBD 2017, Published Sep. 12, 2016 https://www.youtube.com/watch?v=a4NjtgOhErs (Year: 2016).*

* cited by examiner

SYSTEMS AND METHODS FOR GENERATING PMI ASSOCIATION AMONG FEATURES ON A MACHINE PART OF A MODEL

BACKGROUND

The subject matter disclosed herein relates to systems and methods for generating association types to portions of a model, such as models for industrial machine parts.

Industrial machines and machine parts may be designed for a particular purpose, such as a compressor blade designed to compress air. The machine or part may contain many features shared with many portions of the part. Furthermore, these machine parts may include complex designs with many complex features. These features are typically individually managed in a computer aided design (CAD) system, despite their relationship with other components. As such, 3-dimensional (3D) models and/or 2-dimensional (2D) models may be generated to facilitate the manufacturing of the machines and/or the parts. Generally, the features associated with the part may include an attribute of the feature displayed as product and manufacturing information (PMI object), and displaying the PMI object may require a user to manually identify the features associated with the PMI object. The PMI object may include text (e.g., indicative of PMI or characteristics of a feature) displayed on the model of the part. Such method of manually identifying the features associated with the PMI object may be quite redundant, leading to human error and an inefficient use of time.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the claimed subject matter. Indeed, the claimed subject matter may encompass a variety of forms that may be similar to or different from the embodiments set forth below.

In a first embodiment, a system includes a processor for implementing a computer-aided technology (CAx) system, the CAx system including a graphical-user-interface (GUI) that presents a computer-aided design (CAD) model, and the CAD model includes at least one part. Furthermore, the system includes memory storing instructions that cause the processor to present the GUI, receive, via the GUI, at least one indication of an association type and an indication of at least one criteria corresponding to the at least one indication of the association type, iterate the model to identify at least one second feature that satisfies the association type and the criteria, associate and store product and manufacturing information (PMI) with the at least one second feature, generating a PMI association, and display a PMI object of the at least one second feature on the CAD model in the GUI, the PMI object including the PMI.

In a second embodiment, a system includes a computer-implemented method that includes presenting a computer-aided design (CAD) model in a graphical-user-interface (GUI), the CAD model including at least one part. Furthermore, the computer-implemented method includes receiving, via the GUI, at least one indication of an association type and an indication of at least one criteria corresponding to the at least one indication of the association type, iterating the model to identify at least one second feature that satisfies the association type and the criteria, associating and storing product and manufacturing information (PMI) with the at least one second feature, generating a PMI association; and displaying a PMI object of the at least one second feature on the CAD model in the GUI, the PMI object comprising the PMI.

In a third embodiment, a tangible, non-transitory, computer-readable medium, includes computer-readable instructions that, when executed by one or more processors of a computer, cause the one or more processors to present a computer-aided design (CAD) model in a graphical-user-interface (GUI), the CAD model including at least one part, receive, via the GUI, at least one indication of an association type and an indication of at least one criteria corresponding to the at least one indication of the association type, iterate the model to identify at least one second feature that satisfies the association type and the criteria, associate and store product and manufacturing information (PMI) with the at least one second feature, generating a PMI association, and display a PMI object of the at least one second feature on the CAD model in the GUI, the PMI object comprising the PMI.

BRIEF DESCRIPTION OF THE DRAWINGS

These and other features, aspects, and advantages of the present claimed subject matter will become better understood when the following detailed description is read with reference to the accompanying drawings in which like characters represent like parts throughout the drawings, wherein:

DETAILED DESCRIPTION

Figure 1:
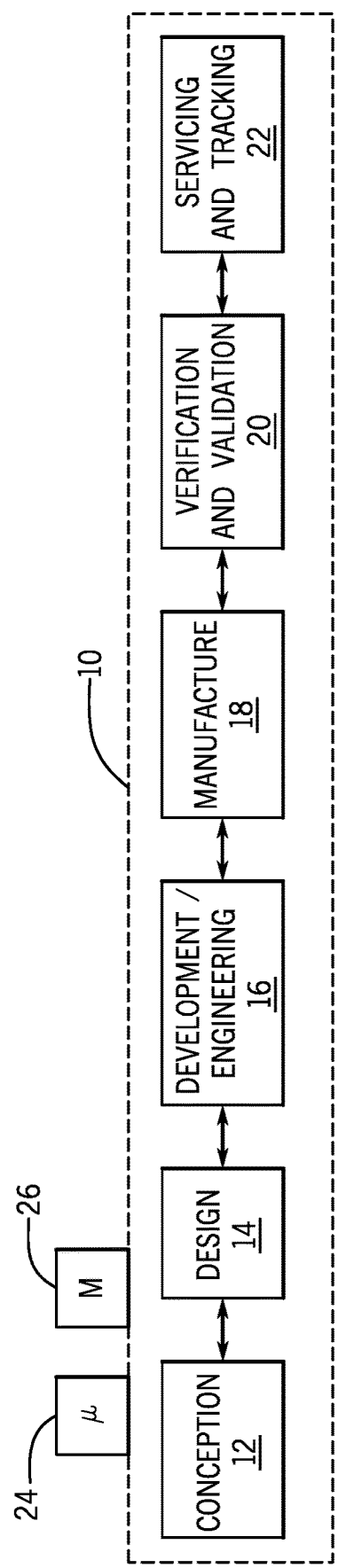
FIG. 1 is a block diagram of an embodiment of a computer-aided technology (CAx) system, in accordance with an aspect of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present claimed subject matter, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a model of the part. For example, the model of the part may be created as a model-based definition included in a 2-dimensional (2D) or a 3-dimensional (3D) computer aided design (CAD) model. The techniques described herein may not create typical engineering part drawing or drawings, as the CAD model may contain all part dimensional and tolerance information.

After creating the 3D CAD part, hereinafter referred to as the "part," a drawing of the part may be generated by a computer-aided technologies (e.g., CAx) system, whereby the drawing may be used to manufacture the part according to the PMI objects (e.g., annotations, callouts, notes, text, etc.) displayed on the drawing and/or model. "Model," used hereinafter, may be used to describe a 2D model, a 3D model, or any other view of a part that may be displayed on a screen, the window of a CAD system, or a sheet of paper as a drawing. As such, drawings and/or the models may contain PMI objects used to describe a feature of the part. For example, there may be an PMI object indicating that a part has three similar through-holes on a front face of a part, such that the aforementioned through-holes are of a certain dimension. In certain embodiments of a model, a part may include many of the same features. For example, a part may contain 1,000 holes on a face.

Generally, a designer (e.g., person designing the part and its features) manually identifies the 1,000 holes on the face and individually designates them with the suitable PMI object indicative of the details of the features (e.g., Product and Manufacturing Information (PMI) of the 1,000 holes). The details may be used to aid in the manufacturing of the part. For example, each hole may have a PMI object indicating the dimensions of the through-hole. Furthermore, certain features of a part may not be selected due to designer (e.g., human) error in manually selecting the features on the face of a part and adding the appropriate PMI object to the features. As such, the PMI objects may be inaccurate because some PMI objects may be missing from the drawing of the part. Since the drawing may be used as instructions to manufacture the part, inaccuracies in the drawing may lead to an inaccurately manufactured part. Furthermore, manually selecting each the features individually (e.g., 1,000 holes) may be a time consuming process. As such, improving the precision and speed by which the features (e.g., 1,000 holes) are identified/selected may increase efficiency.

To increase efficiency and/or correct the inaccuracies that may result from having to manually identifying every feature on a portion of a part and associating it with an PMI object, and thereby make the drawings of a part inaccurate, the CAx system may identify the similar features of a portion of a part that share a given association type and criteria, as discussed in detail below. The CAx system may create an association, hereinafter called "Product and Manufacturing Information (PMI) association." PMI associations link PMI to features. In some embodiments, the PMI associations may be linked in bulk (e.g., many similar features linked to a PMI) by using an association type and/or criteria for the association type, as discussed in detail below. In further embodiments, the PMI association may be generated without a designer having to manually identify every feature before assigning the PMI objects.

With the foregoing in mind, it may be useful to describe a computer-aided technologies (CAx) system that may incorporate the techniques described herein, for example to improve the generation of PMI objects on part drawings. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/surface modeling, parametric models, wireframe models, vector models, non-uniform rational basis spline (NURBS) models, geometric models, 2D manufacturing part and assembly drawings, and the like.

Design models may then be further refined and added to via the execution of development/engineering processes 16. The development/engineering processes may, for example, create and apply models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product. After the part is inspected, results from the CMM process may be automatically generated via an electronic Characteristic Accountability & Verification (eCAV) system.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
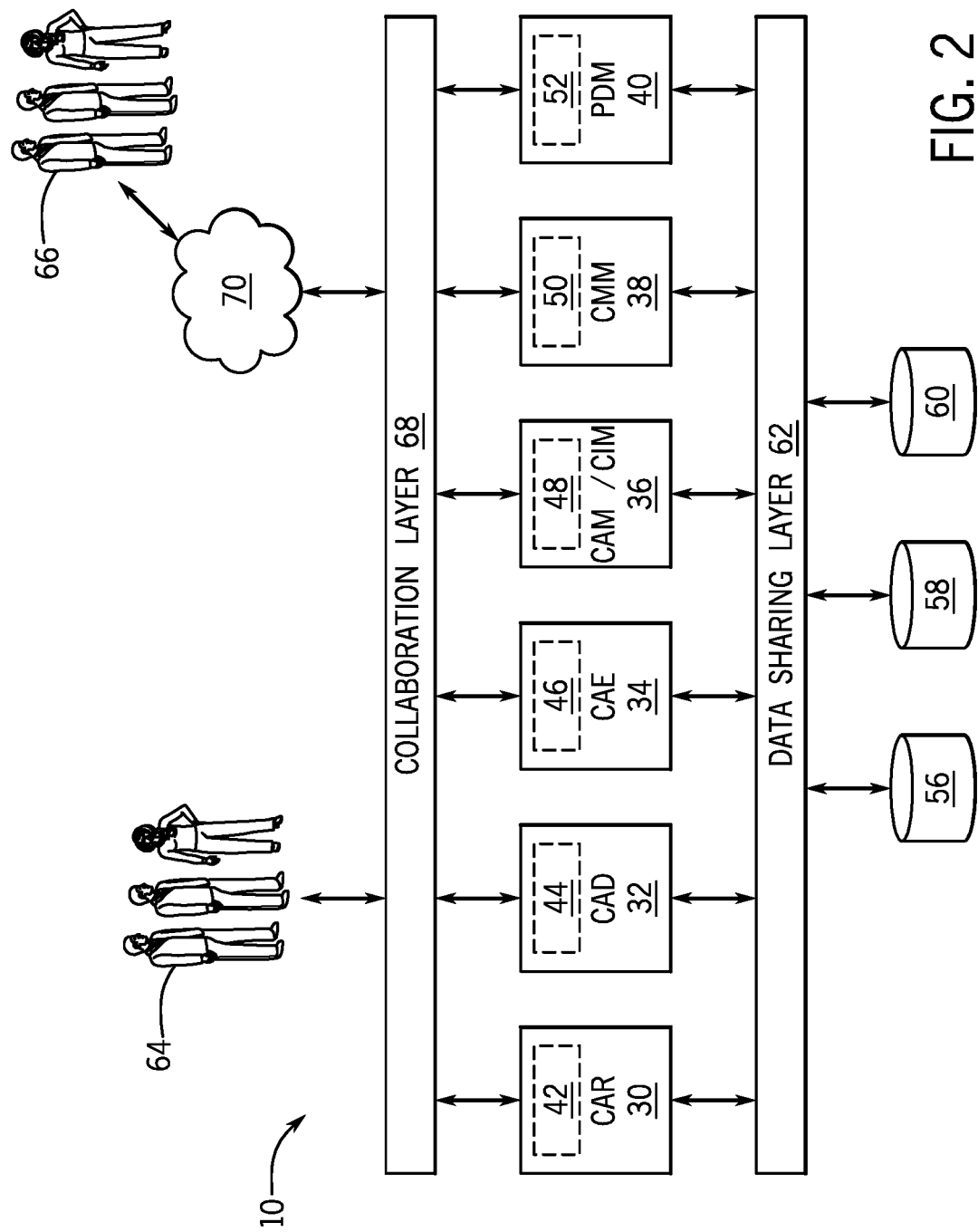
FIG. 2 is a block diagram of a certain components of the CAx system of FIG. 1, in accordance with an aspect of the present disclosure.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable, accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

Figure 4:
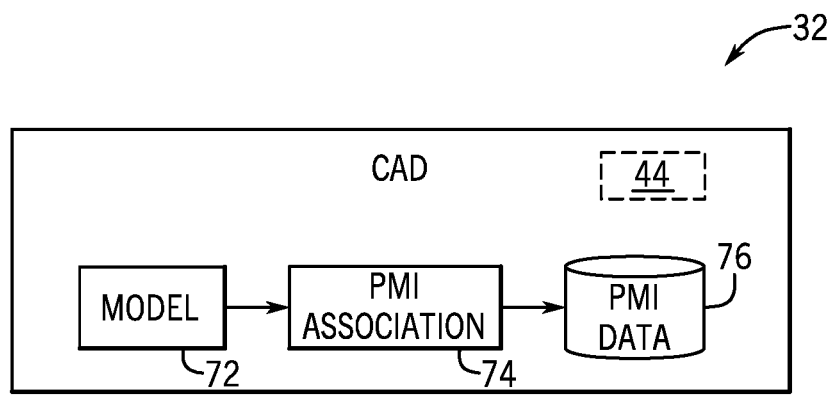
FIG. 4 is a general block diagram illustrating an embodiment of the CAx system components interacting to generate a PMI association, in accordance with an aspect of the present disclosure.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., views, drawings, annotations, notes, PMI object, etc.). Indeed, the CAD system 32 may combine a graphical representation of the part or product with other, related information. Further, the CAD system 32 may adjust the PMI object displayed on various drawings displaying multiple views and/or orientations of the same part, as discussed in detail in FIG. 4.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on.

The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, and/or 38 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, and 38 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management.

Figure 3:
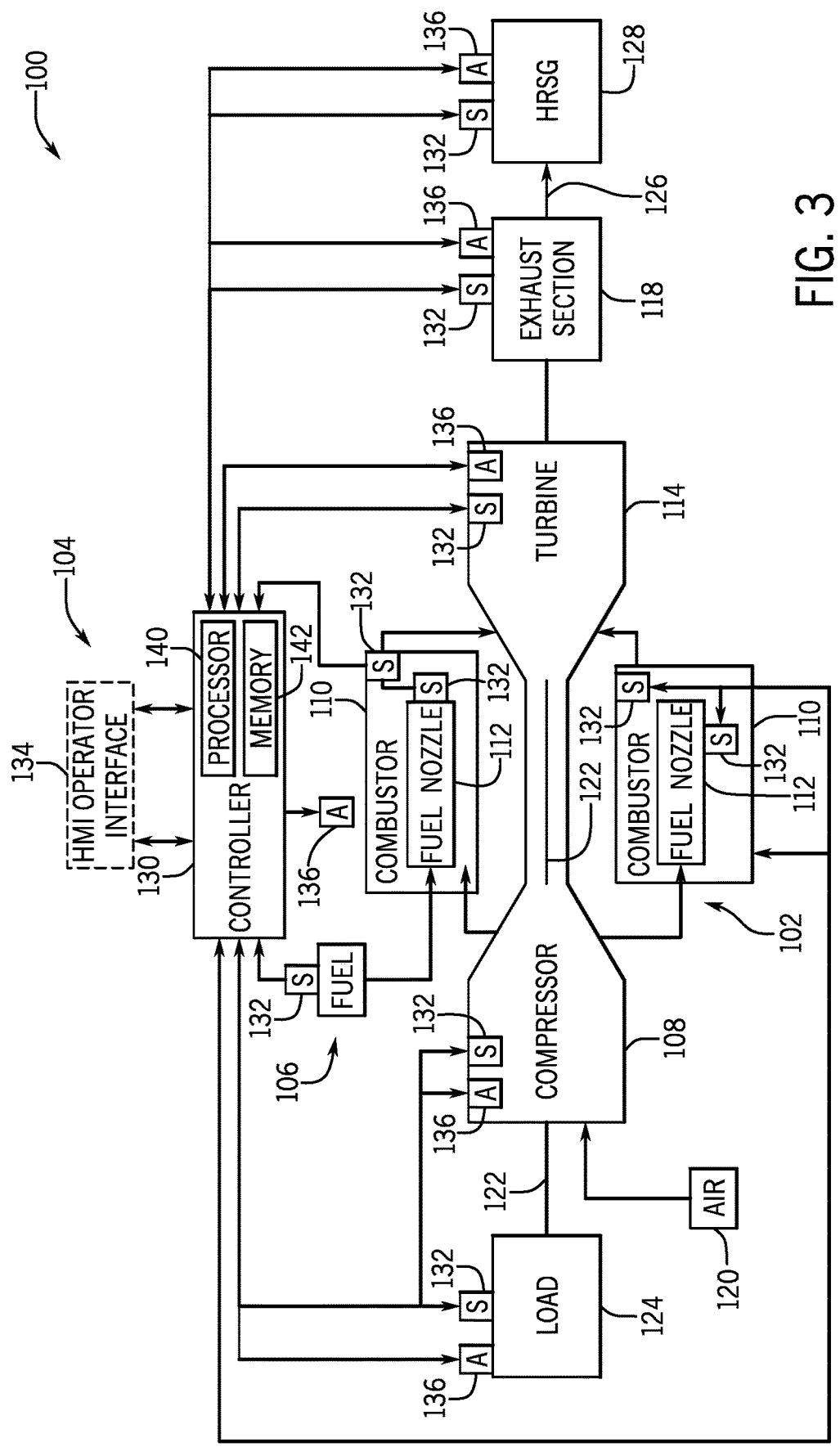
FIG. 3 is block diagram of an industrial system that may be conceived, designed, engineered, manufactured, and/or service and tracked by the CAx system of FIG. 1, in accordance with an aspect of the present disclosure.

It may be beneficial to describe a machine that may incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power plant 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors 110, the turbine 114, the exhaust section 118, the load 124, the HRSG 128, and so forth.

In certain embodiments, the HMI operator interface 134 may be executable by one or more computer systems of the system 100. A plant operator may interface with the industrial system 10 via the HMI operator interface 44. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Drawings and/or models for the aforementioned parts of the industrial machinery may be generated to aid in the processes 12, 14, 16, 18, 20, and 22, for example, via the CAx system 10. More specifically, the models may include PMI object (e.g., text indicative of PMI) that are illegible (e.g., too small or too large, oriented at an angle, etc.). FIG.

4 is a general block diagram illustrating an embodiment of the CAD system 32, which may generate a model 72, PMI associations 74, and/or PMI data 76.

In more detail, the model 72 generated by the CAD system 32 may be a drawing of a part or an assembly of, for example, industrial machinery. That is, a model 72 may be a 3D representation of the part, such that the 3D representation of the part may be manipulated and/or oriented to any given view on the CAD system 32 via inputs to a user interface on the CAD system 32. For example, the user interface may contain an arrow that may be used (e.g., via a user input like a computer mouse) to manipulate and/or orient the model 72 of a part to a specified view. As such, some views of the model 72 may contain more details or different details than that of other views. For example, a front view of a model 72 may show features (e.g., holes) only on the front face of the part displayed by model 72. In contrast, a rear view of the model 72 may not show the features (e.g., holes) only present on the front face of the part displayed by model 72 (e.g., when the holes are not through holes to extend from the front of the model to the back of the model). As such, a front view of the model 72 may be more appropriate than that of a rear view of model 72 if the features of interest are only present on the front face of model 72.

Furthermore, PMI associations 74 may be associated with the model 72. PMI associations link PMI data to features. In some embodiments, the PMI associations are linked in bulk (e.g., many similar features linked to common PMI) by using an association type and/or criteria for the association type, as discussed in detail below. The PMI associations 74 may be stored in the memory or the data-sharing layer mentioned above. In more detail, a feature is any characteristic of model 72. Such features may include, hole dimensions, chamfered edge sizes, welding specifications, and/or any other features that may be designed (e.g., manufactured) into a part. As mentioned above, PMI may be any description of the feature that may be used and aid in the manufacturing of the feature into a part containing said feature. Furthermore, an association type may be a scheme for identifying a characteristic that the aforementioned feature shares with other similar features, where these shared characteristics may be used to link the feature to the PMI. The criteria may then be a metric by which the characteristic is further specified.

For example, the model 72 may be a part of industrial machinery, such that the part has a front face with 1,000 similar through-holes of the same dimensions on the front face. In this example, to apply PMI associations to the 1,000 through holes (e.g., the features) "faces of similar surface area" may be a common association between these features, and thus may be selected as the association type. Further, when concerned with the holes on a particular face, the criteria may be a face containing these 1,000 holes (e.g., front face). Instructions stored on a computer readable medium may, when executed, cause a processor to generate PMI associations 74, linking the features based upon the association type and/or the criteria, in the manner discussed above.

In certain embodiments, the generated PMI associations 74 may be compiled and stored as PMI data 76 in the memory and/or data repositories mentioned above. That is, the PMI associations 74, their respective features, association type, and criteria may be stored as part of the PMI data 76. PMI object displayed on the model may be generated from the PMI data 76. The PMI object may include a text description of the feature that is displayed on the model of the part. For example, a PMI object for a given through-hole (e.g., or any other feature) may include, as an annotation displayed on the model, text indicating the dimensions (e.g., radius, thread sizes, and/or any other PMI) of the hole. The PMI data 76 may be retrieved by the processor of the CAD system 32 to generate drawings with PMI objects (e.g., text indicative of PMI associated with a part and/or feature).

Figure 5:
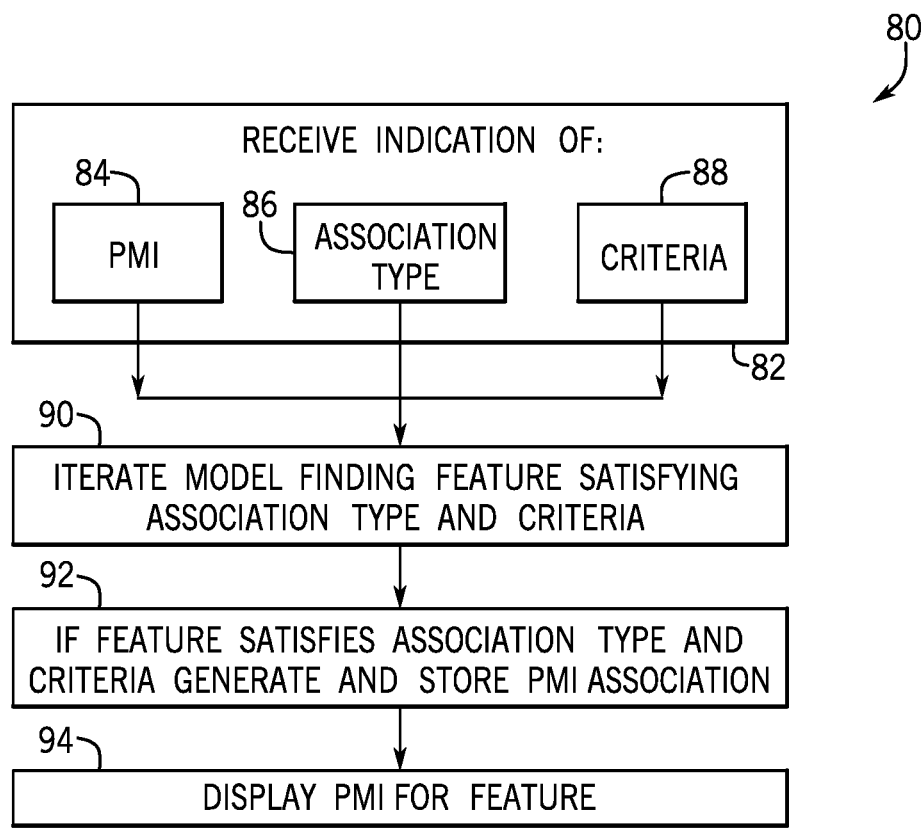
FIG. 5 is a process flow diagram illustrating an embodiment of a method whereby a PMI association is generated, in accordance with an aspect of the present disclosure.

FIG. 5 is a process flow diagram 80 illustrating an embodiment of a method whereby a PMI association, linking a feature to PMI, is generated. More specifically, process flow diagram 80, receives an indication of the feature 84, the association type 86, and the criteria 88 (process block 82); iterates the model to find features satisfying the association type and the criteria (process block 90); if a feature satisfies the association type and criteria (process block 92), the PMI association is generated and stored; and a PMI object is displayed for the feature (process block 94), such that the PMI object may include text indicative of GD&T information associated with the feature.

A processor of the CAx system may contain computer readable instructions, stored on a computer-readable medium that, when executed by the processor, cause the processor to perform the aforementioned tasks. More specifically, the processor may receive indications of a feature 84, an association type 86, and criteria 88 (process block 82). For example, as mentioned above, the user interface may provide a user a tool of selecting a feature on a model of a part. The tool on the user interface may be an arrow or other icon controlled by a keyboard and/or mouse, such that the arrow or icon indicated selection of a feature 84 on the part by hovering over the feature 84 on the part and selecting the feature 84 (e.g., via clicking on the computer mouse). The selection of the feature 84 may send a signal that is processed by the processor indicating the selected feature was received. In a similar manner, the indications of the association type 86 and the criteria 88 may be received via a similar tool selection process of the user interface.

Moreover, the processor may receive an indication of the association type 86 (process block 82) via the user interface on the CAD system. In certain embodiments, the indication of the association type 86 may be indicated by selecting one association type from a list of options on the user interface of the CAD system. As described in detail below, in some embodiments, the indication of the association type may be a selection of at least one association type 86 from a list of association types. As specified above, the association type 86 may indicate a characteristic that the aforementioned feature 84 should share with other features for bulk association of PMI data.

For example, a feature (or a face of a feature) such as a through-hole of a given size may be selected as a first feature 84 and "faces of similar surface area" may be selected as the association type 86. That is, the given through-hole includes a face of a certain surface area. "Faces of similar surface area" indicates instructions that cause the processor to scan features with a similar target surface area (e.g., here a size of a resultant face of through hole) to find a second feature (e.g., or any number of additional features) similar to the specified feature 84, which in this example, is a through-hole of a given size (e.g., having a similar face surface area).

In some embodiments, it may be useful to associate PMI with all features and/or common features disposed on a common face of the model. Accordingly, as a further example, the aforementioned through-hole (e.g., feature) may be selected as the first feature 84 and "faces of a feature" may be selected as the association type 86. That is, the given through-hole includes a certain face (e.g., may be included on the front face of the part). "Faces of a feature" indicates instructions that cause the processor to scan features with the same face to find a second feature (e.g., or any number of additional features) similar to the specified first feature 84, which in this example, is a through-hole of a given size (e.g., being located on a similar face as the first feature). Furthermore, it may be useful, in some embodiments, to specify a criteria 88, where the criteria would specify which face to use as the choice for "faces of a feature."

In some embodiments, it may be useful to associate PMI with all features having a certain characteristic. Accordingly, as a further example, the aforementioned through-hole (e.g., feature) may be selected as the first feature 84 and "faces of same color" may be selected as the association type 86. That is, the given through-hole includes a face of a target color. "Faces of same color" indicates instructions that cause the processor to scan features of the target color to find a second feature (e.g., or any number of additional features) of a similar color to the specified first feature 84, which in this example, is a through-hole of a given color (e.g., a blue through-hole). Furthermore, it may be useful, in some embodiments, to specify a criteria 88, where the criteria would specify which face to use as the choice for "faces of same color."

While only three embodiments of association types 86 are discussed in detail above, in certain embodiments, other association types 86 may be utilized to indicate a characteristic that a feature 84 should share with other features for bulk association of PMI. Furthermore, any combination of association types 86 may be used to further specify characteristics that a feature 84 should share with other features for bulk association of PMI.

For example, the association types 86 may include "faces of shared tangency," where multiple faces that collectively assemble a free form surface may be associated with PMI, although the faces may not share a feature or a surface area. As such, the association type "faces of a shared tangency" may associate PMI to the shared tangency (e.g., the free form surface area).

As another example, the association type 86 may include "faces of applying to a portion of the model mid-manufacturing-process (MMP)," where a PMI may be associated with a specific manufacturing stage (e.g., casting, machine passes, finishing passes). That is, "faces of applying to a portion of the MMP" may associate PMI to a characteristic indicative of a specific manufacturing stage.

Turning our attention to the criteria 88, in certain embodiments, the criteria 88 may be a metric by which the association type 86 is further specified. As such, the processor may receive an indication of the criteria 88 (process block 82). In certain embodiments, the indication of the criteria 88 may be indicated by selecting one or more criteria from a list of options (e.g., stored in the memory of the CAD system) on the user interface of the CAD system. In certain embodiments, as described in detail below, the indication of the criteria 88 may include selecting at least one criteria from a checklist of criteria. Additionally, in certain embodiments, the indication of the criteria 88 may be selected by selecting a portion of the part that contains the aforementioned feature 84 that further specifies the association type 86 and displaying the portion of the part as a seed object, as described in detail below. For example, to continue the example above, the feature may be a through-hole of a given size contained on a front face of a part, the association type may be (e.g., a scheme containing options such as) "faces of a feature," and the criteria 88 may be the front face of the part, which may be selected by accordingly orienting the model and selecting (e.g., via the user interface, clicking on the front face etc.) the front face. The processor may process the selection of the front face to receive the front face, in this example, as the indication of the criteria 88.

After indications of the feature 84, association type 86, and the criteria 88 are received, the processor may iterate the model to find similar features satisfying the association type 86 and criteria 88 (process block 90). That is, the processor may scan every feature 84, association type 86, and/or criteria 88 in the model after an indication of each of the aforementioned items is received. In certain embodiments, while iterating the model, the features 84, association types 86, and criteria 88 that match the indication of the feature 84, association type 86, and criteria 88, respectively, may be stored in the memory. For example, a user may specify a through-hole on the front face of a part as the feature 84, "faces of similar surface area" as the association type 86, and the front face of the part as the criteria 88. The processor will iterate the model to find features that satisfy the target association type and criteria. To continue the aforementioned example, the processor may find the given through-holes (e.g., feature 84) that satisfy "faces of similar surface area" (e.g., association type 86), such that the criteria 88 further specifies the front face. In other words, the processor may find other through-holes on common faces of the part with a similar surface area to the surface area of the selected feature (e.g., the specific through-hole designated as the feature 84). In certain embodiments, the features 84, and their respective association type's and criteria may be stored in a computer-readable format in a computer-readable medium (e.g., the memory) that may be accessed by the processor.

After the processor iterates the model, if a feature identified by the processor satisfies the target association type 86 and the criteria 88, a PMI association is generated and stored (process block 92), for example, as PMI data in memory. As mentioned above, PMI associations link PMI to features (e.g., a first feature, a second feature, etc.). In some embodiments, the PMI associations may be linked in bulk (e.g., many similar features linked to a PMI) by using an association type and/or criteria for the association type. In certain embodiments, many features may correspond to one association type and criteria, such that the many features and the one association type and the one criteria may be collectively stored as one PMI association.

Furthermore, the processor may display PMI objects (process block 94) on the model. As mentioned above, the PMI object may be any text on the model that correspondingly describes the feature or characteristics, such as PMI data associated with the feature. For example, there may be PMI object displayed on the model, such that the PMI object indicates that a part has three similar through-holes of a certain dimension on a front face of the part. In certain embodiments, the part displayed on a model may have three such PMI objects (e.g., displayed as text indicative of characteristics of the hole), one corresponding to each of the three holes. The PMI object may indicate, for example, the size and type of hole. In certain embodiments of a model, a part may include many of the same features. For example, a part may contain 1,000 holes (e.g., similar features) on a front face. The holes and their corresponding association type and criteria may be stored in the PMI association, such that a single association may be used to associate PMI for each of the similar features.

Figure 6:
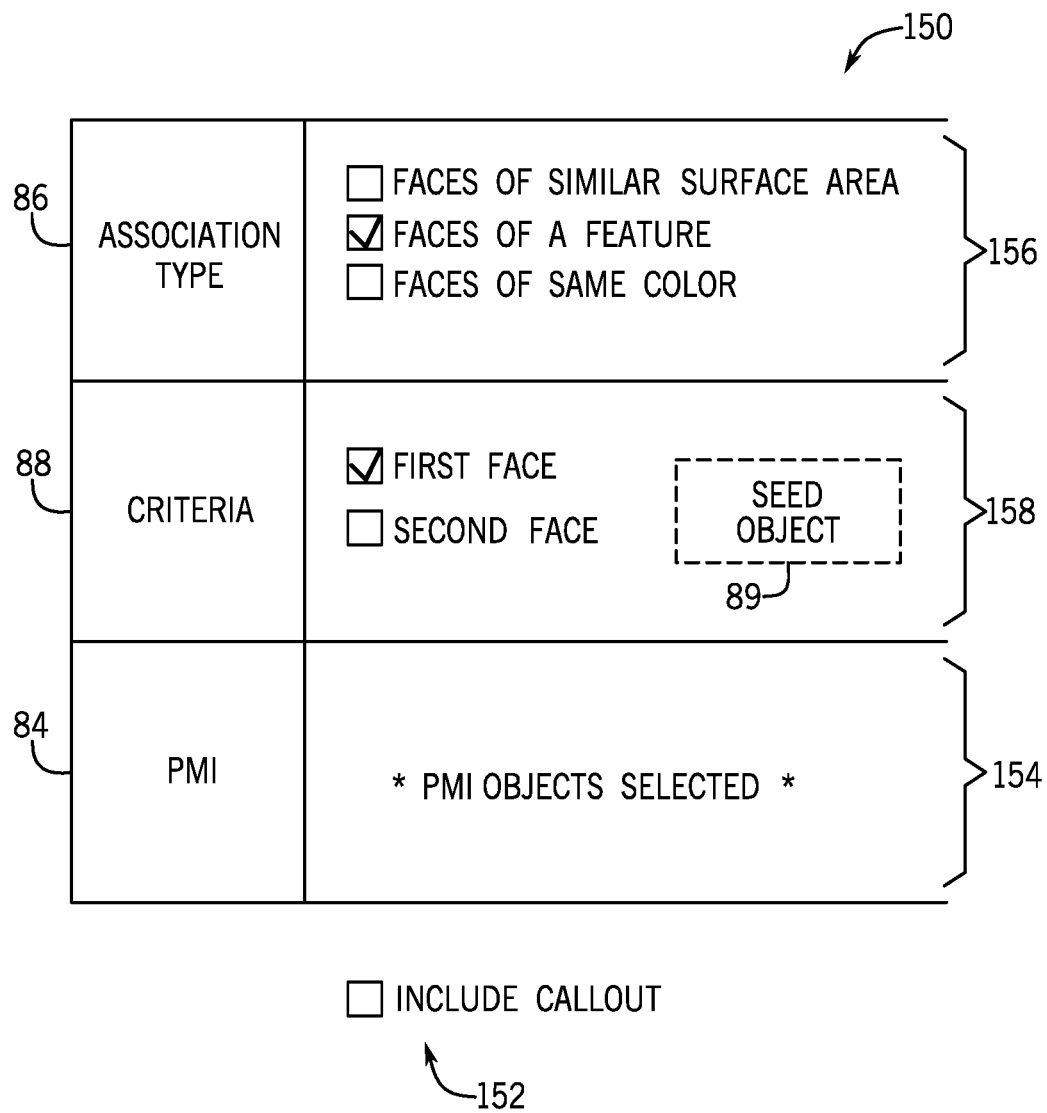
FIG. 6 is a schematic illustrating an embodiment of the CAx system user interface, in accordance with an aspect of the present disclosure.

FIG. 6 is a block diagram illustrating an embodiment of the user interface 150 of the CAx system. As illustrated, the user interface 150 includes a section for specifying the association type 86 and corresponding association type options 156, a second section for specifying the criteria 88 and corresponding criteria options 158, and a third section for specifying the PMI 84 and a list 154 of the PMI selected, such that the PMI selected may be an annotation selected on the CAD model. In certain embodiments, the user interface 150 may receive indications of a specified PMI 84 (e.g., such as a PMI object including PMI for the feature) and display the specified PMI object in the list 154 of the user interface 150. That is, a user may select a PMI 84 of a part by hovering over the part with an arrow and selecting the feature on the part by clicking a mouse while the arrow is over the feature. In some embodiments, a user may manually input characters (e.g., symbols, letters, numbers, etc.) to specify the PMI 84. After the PMI 84 is selected, an indication that the PMI object of a feature was selected may be displayed on the list 154. For example, a user may select the PMI object (e.g., that may reference a through-hole) displayed on the front face of a part as the PMI 84. After the PMI object (e.g., of the through-hole) is selected, the PMI may appear on list 154. Additionally and/or alternatively, a prompt for manually entering PMI may be provided in the PMI section 84, allowing a user to enter PMI into a text box or other input box without selecting pre-existing PMI object from the model.

In some embodiments, a selection of the association type may be made by selecting one or more of the association type options 156. As illustrated, association type options 156 may include "faces of similar surface area," "faces of a feature," "faces of same color," and/or the other suitable association type options, such that association type options 156 may be a way of deciding on a characteristic that a feature of the part may share with other features.

Furthermore, the criteria 88 may be a metric by which the association type 86 is satisfied. Since the association type options 156 include ways of associating PMI 84 to features of the part (e.g., either through similar surface area, color, etc.), in the illustrated embodiment, the criteria options 158 include a list of faces that a user may choose from (e.g., a first face, a second face, etc.). In addition or alternatively, the criteria options 158 may include a seed object 89 (e.g. a feature of the part) that a user may specify to further specify the association type options.

In more detail, the association type 86 may associate the selected feature and its PMI 84 to any other features of the part by selecting the feature(s) as a seed object 89. The seed object 89 may be any feature of the part that may be selected as the criteria 88 to further modify the association type 86 as described in detail below. Accordingly, the criteria 88 may display criteria options 158, that may be something other than a list of faces (e.g., the criteria 88 may be seed object 89). In some embodiments, the criteria options 158 may include a list indicative of the characteristics of interest in the association type options 156. For example, when "Faces of Same Color" is selected as the association type 86 and a seed object 89 is selected, the color of the seed object 89 may be used as the criteria 88.

To continue the aforementioned example, after the through-hole is selected, the processor may receive an indication of a selection of association types 86, and display the selection on the list of the association type options 156. For example, as illustrated, the processor may receive indications (e.g., via selected boxes on the user interface) specifying "faces of a feature" as the association type 86. In certain embodiments, the processor may identify the face containing a first feature (e.g., the through-hole) displayed in list 158 as seed object 89 and selected PMI 84 displayed on list 154 to identify similar features on the faces containing the features designated as the seed object 89. For example, when "faces of a feature" is specified as the association type 86, the processor may find similar though-holes on the front face, which is the face containing the through hole, as the seed object 89.

Furthermore, if the through-hole (e.g., or any specified seed object 89) is contained in more than one face, by specifying in the criteria options 158 more than one face, more than one face may be searched to identify similar features. For example, as illustrated, the user interface 150 may have a check box of a first face, a second face, etc. specifying which "faces of a feature" that may be searched to find the feature (e.g., which in this example, is a given through-hole) specified as the seed object 89 and its corresponding PMI 84. That is, if the feature selected is on the first face, but similar features are on the second face, unless the second face option is also checked on the criteria options 158, the processor may only find and store PMI associations on the first face because "face of a feature" is the association type and only the first face option is checked on the criteria options.

In some embodiments, common characteristics of a feature may be used to identify a bulk set of features to apply particular PMI. Accordingly, as a further example, PMI of a given through-hole may be selected as the PMI 84 and displayed on list 154. "Faces of same color" may be selected as the association type 86. The blue through-hole may be selected as the seed object 89 for the criteria 88. That is, the given through-hole (e.g., feature) may be of a target color (e.g., blue). "Faces of same color" indicates instructions that cause the processor to scan features on faces that satisfy the target color (e.g., blue) to find a second feature (e.g., or any number of additional features) that are of the target color (e.g., features that satisfy the association type 86). That is, the processor may receive indications (e.g., via selected boxes on the user interface) specifying "faces of same color" as the association type 86. In certain embodiments, the processor may identify features on the part of the target color (e.g., where the seed object 89 may be specified to be the blue through-hole and may be displayed on list 158). As such, the processor may find similar though-holes that are blue, which is the color of the seed object 89 displayed on list 158, thereby generating a PMI association between the PMI 84 (e.g., specified on list 154) and blue through-holes (e.g., features), when the features satisfy the criteria and association type.

As mentioned above, in some embodiments, it may be useful to associate features of a similar size (e.g., features with faces having a similar surface area) with certain PMI. Accordingly, as a further example, PMI of a given through hole may be selected as the PMI 84 and "faces of similar surface area" may be selected as the association type 86. Further, the given through hole may be selected as the seed object 89, as the criteria 88. The given through-hole includes a target surface area. "Faces of similar surface" indicates instructions that cause the processor to scan features (e.g., through-hole) and identify those criteria (e.g., the given through-hole) with a similar surface area as that of the given through-hole. As such, the processor may find though-holes of a similar surface area as that of the through-hole specified as the seed object 89 of the criteria 88, and generate a PMI association between the through-holes (e.g., that satisfy the criteria 88 and association type 86) and the PMI 84.

In certain embodiments, the user interface 150 may further include a selection box 152 for including a callout on the model (e.g., 3D drawing) of the part. The callout may be text indicative of the number of features that may share PMI. Selecting the selection box 152 may result in displaying a number as a callout on the model, such that the number may reference the quantity of features that share the referenced PMI. Alternatively, in certain embodiments, not selecting the selection box 152 may result in omitting callouts (e.g., number indicative of how many features share the PMI) from being displayed. By selecting selection box 152, in some embodiments, the PMI object (e.g., text indicative of characteristics of a feature) may be displayed on the model of the part. For example, if the selection box 152 is selected, the PMI object for the features may be displayed on one of the through-holes and a number (e.g., the callout) describing the number of through holes that share PMI may be displayed on the model.

Figure 7:
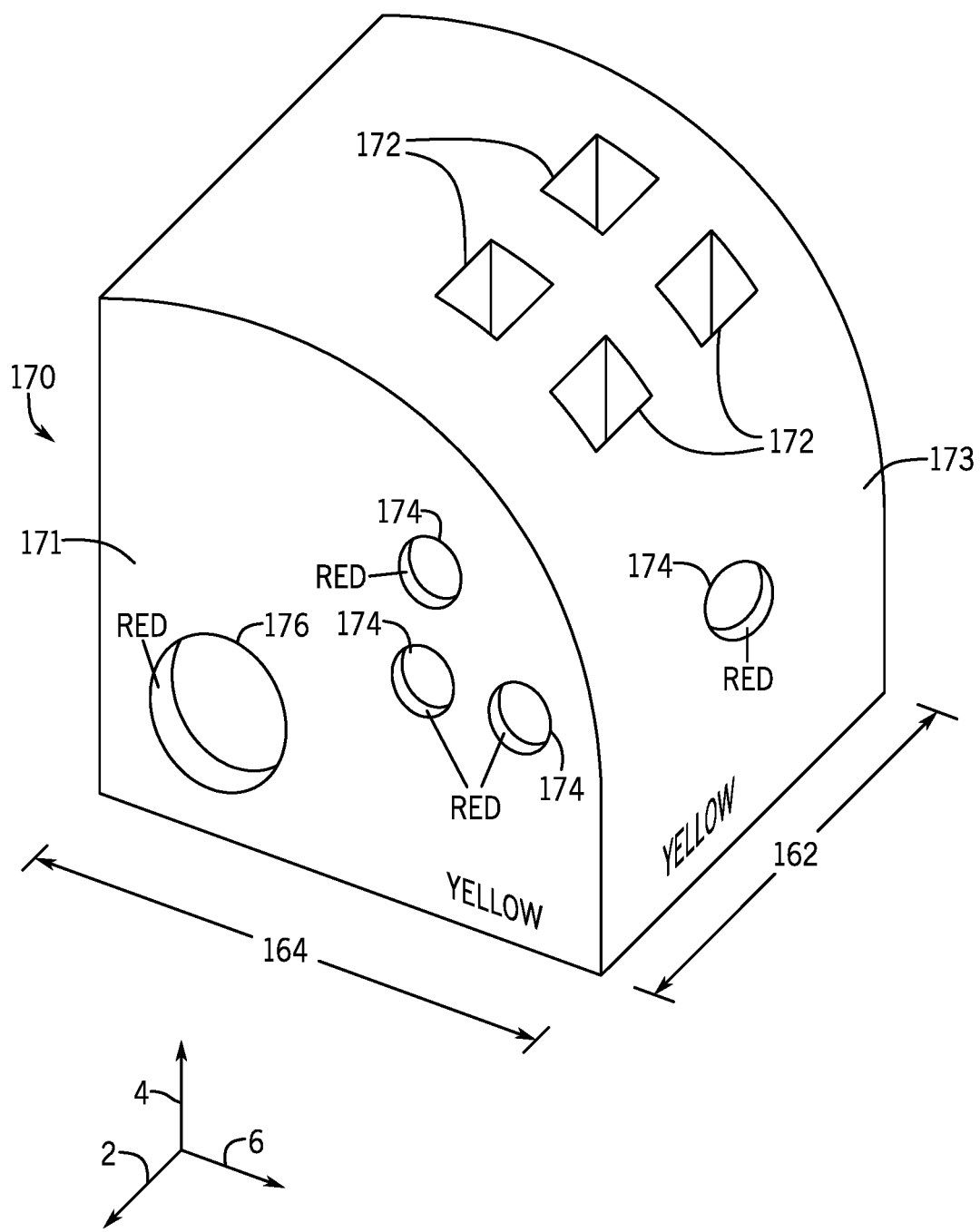
FIG. 7 is an illustration of a perspective model view of a part and its features, in accordance with an aspect of the present disclosure.

As an example, FIG. 7 is an illustration of a perspective view of a part 170 and its features. The perspective view is a 3D view of the part 170, such that the part is a quarter section of a cylinder with height 162 and radius 164. Illustrated is a coordinate system, containing a forward direction 2, an upward direction 4, and side direction 6. The part 170 has a front face 171 oriented such that the front face 171 is facing the forward direction 2 and is a yellow color. Moreover, the entire outer surface of part 170 is yellow and the interior of the part 170 is red. Furthermore, the part 170 includes four holes 174 with a small diameter, a hole 176 with a large diameter, and four square through holes 172, such that three holes 174 and the hole 176 are on the front face 171 of part 170, and the four square holes 172 and one hole 174 are on the side face 173 of part 170. Part 170 may be designed on the CAD system and the illustrated embodiment includes a part displayed on the user interface of the CAx system in any orientation. For example, part 170 may be rotated via instructions executed by the processor, upon a request to orient the part 170, such that the processor executes the request to accordingly orient the part 170. The request to orient the part may be any user input into the user interface of the CAD system.

For example, a hole 174 (e.g., feature) located on the side face 173 may be selected as the seed object. The PMI of the hole 174 may be specified as the PMI. "Faces of similar surface area" may be selected as the association type. "Faces of similar surface area" indicates instructions that cause the processor to scan the holes 174 that are associated with the surface area of the hole 174. That is, the processor may identify holes associated the surface area that is similar to that of the first feature (e.g., such that the hole 174 on the side face 173 includes the first feature). In certain embodiments, the processor may identify the features (e.g., holes) containing the same surface area and associate those features to the specified PMI. That is, the processor may generate a PMI association, associating the PMI to features that satisfy the association type and criteria. In other words, the processor may identify the holes 174 having a similar surface area as the hole 174 on the side face 173, and associate them with the specified PMI. As a result, in the illustrated embodiment, the processor may link the one hole 174 on the side face 173 and the three holes 174 on the front face 171 to the specified PMI because those holes satisfy the association type (e.g., similar surface area holes) and criteria (e.g., the surface area of the selected seed object hole).

As a further example, a hole 174 (e.g., feature) located on the front face 171 may be selected as a seed object. Further, its PMI may be selected as the PMI. "Faces of same color" may be selected as the association type. "Faces of same color" indicates instructions that cause the processor to scan for features that are associated with a particular color. Further, because selected hole 174 is red, red is selected as the criteria. In some embodiments, a selection of a particular option may be provided in the criteria 88 section, rather than selecting a seed object.

In reference to the illustration, for example, the processor may scan the features of the part to identify features that satisfy the criteria and association type. Accordingly, the system may find holes 174 and hole 176 associated with the color red and associate the red holes 174 and 176 to a PMI association. That is, the processor may identify the three red holes 174 on the front face of part 170, the one red hole 174 on face 173, and hole 176 and generate a PMI association linking the aforementioned PMI to the these holes 174 and 176 because they satisfy the specified association type (e.g., "faces of same color") and criteria (e.g., red color).

As another example, the hole 174 (e.g., feature) located on the front face 171 may be selected as the first feature and its PMI may be selected. "Faces of a feature" may be selected as the association type. "Faces of a feature" indicates instructions that cause the processor to scan features (e.g., holes 174) that are associated with a face that that the first feature is disposed on. Further, the front face 171 may be specified as the criteria. That is, the processor may scan for features associated with the front face 171, since the front face 171 is selected as the criteria and hole 174 on the front face 171 is the first feature. In certain embodiments, the processor may identify similar holes 174 (e.g., features) associated with front face 171. In other words, the processor may identify holes 174 associated with the front face and link the holes 174 with the PMI. As a result, in the illustrated embodiment, the processor may link the three holes 174 on the front (e.g., yellow) face 171 to a PMI. However, since the hole 174 on the side face 173 is not associated with the face (e.g., front face 171) that includes the first feature, the hole 174 on the face 173 may not be linked to the aforementioned PMI.

While the above examples provide one association type and one criteria, in certain embodiments, multiple association types and criteria may be utilized. For example, in some embodiments, any combination of "Faces of Similar Surface Area," "Faces of a Feature," and/or "Faces of Same Color" may be used in conjunction with one another. For example, if "Faces of Same Color" was selected with a criteria of Red color and "Faces of Similar Surface Area" was selected with a criteria of the surface area of one of the holes 174, all of the holes 174 would be selected for application of the PMI. Further, if "Faces of a Feature" was added as an additional association type with a criteria of the front face 171, only the red holes 174 on the front face would be selected. Red hole 176 would not be selected, because it has a face with surface area that does not match the surface area criteria. Further, hole 174 on face 173 would not be selected, because it is not on the front face 171.

Figure 8:
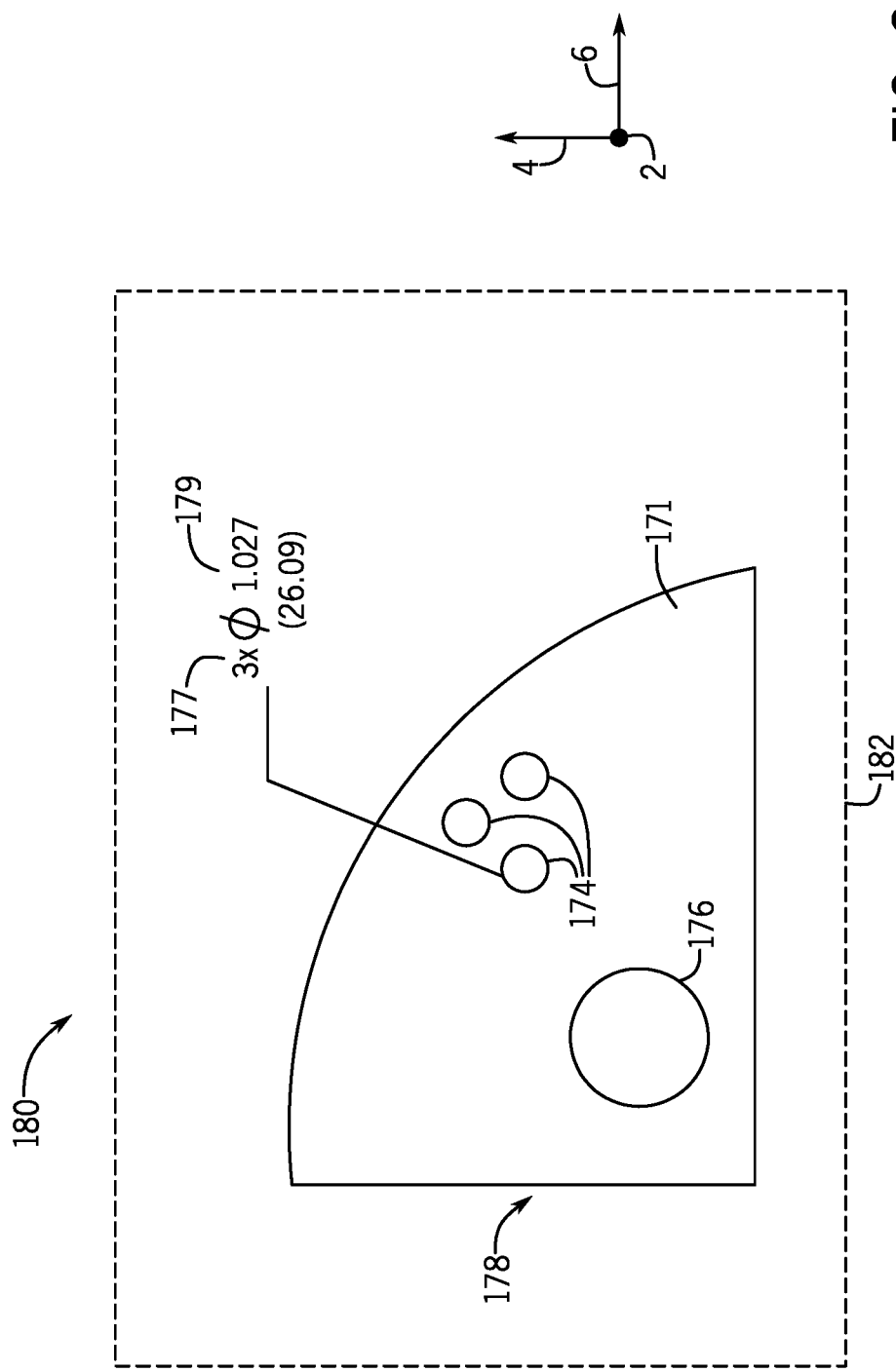
FIG. 8 is an illustration of a front model view of the part of FIG. 7 and its features, in accordance with an aspect of the present disclosure.

FIG. 8 is an illustration of a front view 180 of the part 170 of FIG. 7 and PMI objects 179, indicative of a text description of the PMI associated with a feature. As illustrated, the PMI object 179 includes text "ø1.027 (26.09)," which is PMI associated with holes 174 located on the front face 171, such that the text includes information (e.g., dimensions or other information) that may aid in the manufacturing of the part and its features. In some embodiments, the selection box 152 of the user interface 150 illustrated on FIG. 6 may be selected to display the callout 177 and PMI object 179 illustrated on FIG. 8. When selection box 152 is selected, the callout 177 may be displayed in front of the PMI object 179. In the illustrated embodiment, the callout 177 (e.g., "3×") is included to reference the three features (e.g., holes 174) that share the PMI "ø1.027 (26.09)."

Furthermore, part 170 is oriented away from a perspective view (e.g., of FIG. 7) to a front view (e.g., of FIG. 8). Orienting the part 170 to a front view orients the part 170 to a position such that the forward direction 2 point normal to the view (e.g., outward from the display), the upward direction 4 points upward from the base of the part 170, and the side direction 6 is perpendicular to the plane formed by the upward direction 4 and the forward direction 2. Furthermore, illustrated is callout 177 and PMI object 179 for holes 174 on the front face of part 170. As mentioned above and as illustrated, the part 170 includes three holes 174 with a small diameter and a hole 176 with a large diameter such that the three holes 174 and the hole 176 are on the front face of part 170. Furthermore, PMI linking the small holes 174 to the front face of the part 170 may be generated and PMI object 179 may be displayed on the view of part 170 (e.g., based upon association type and criteria, as discussed above). As illustrated, the PMI object 179 is located on plane 182, such that the plane 182 lies on the front face of part 170 and is perpendicular to the forward direction 2 and parallel to the plane formed by the upward direction 4 and the side direction 6.

Figure 9:
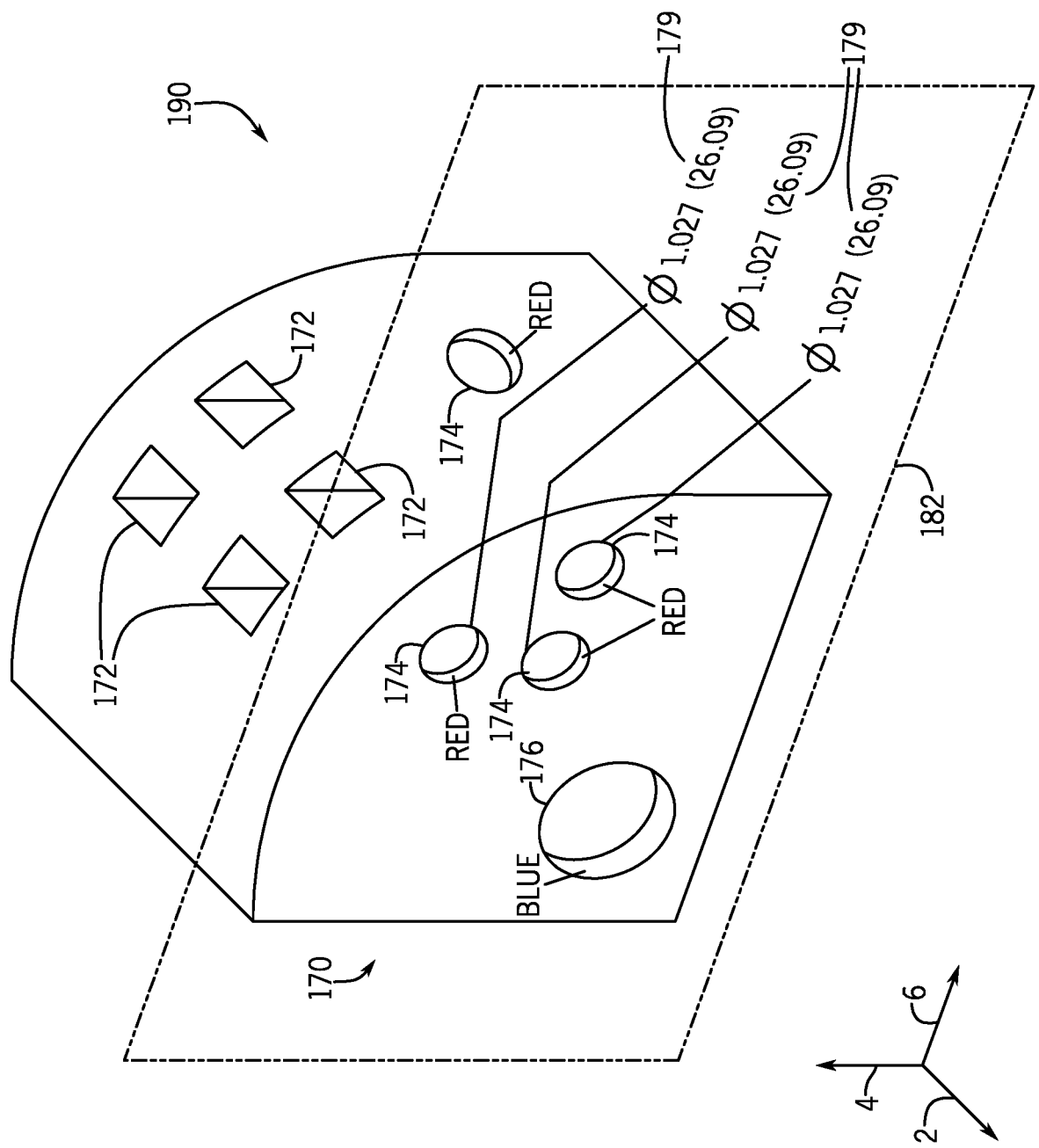
FIG. 9 is an illustration of the perspective model view of the part of FIG. 7 including callouts indicative of the association tags, in accordance with an aspect of the present disclosure.

FIG. 9 is an illustration of the perspective view of the part 170 of FIG. 7 including PMI objects 179 for the holes 174. As mentioned above, PMI objects 179 may include PMI (e.g., GD&T information) for a feature. As illustrated, the PMI objects 179 generated on the front view of FIG. 8 are oriented in such a way that the text of the PMI objects 179 is not oriented normal to the display. Instead, the PMI object 179 is oriented normal to the plane 182 facing the forward direction 2 in line with the face (e.g., front face) the features are located on. In this example, the part 170 is oriented from a front view to a perspective view causing the PMI object 179 to orient accordingly. The PMI object 179 may be oriented to match a different orientation of the figure (e.g., rear view, top view, bottom view, etc.), thereby making the PMI object 179 illegible in certain embodiments. For example, if the front view of the model is flipped about a plane to show a rear view of the part, the PMI object 179 may also be flipped, thereby making the PMI object 179 illegible and/or difficult to view (e.g., the text may also be flipped, thereby making it inverted and flipped). As such, it may enhance legibility to orient the PMI object 179 normal to the display (e.g., piece of paper, screen, computer monitor, CAD system user interface, etc.) instead of leaving the orientation of the PMI object 179 normal to the original plane it was developed on (e.g., and or oriented in any other direction other than normal to the display).

Figure 10:
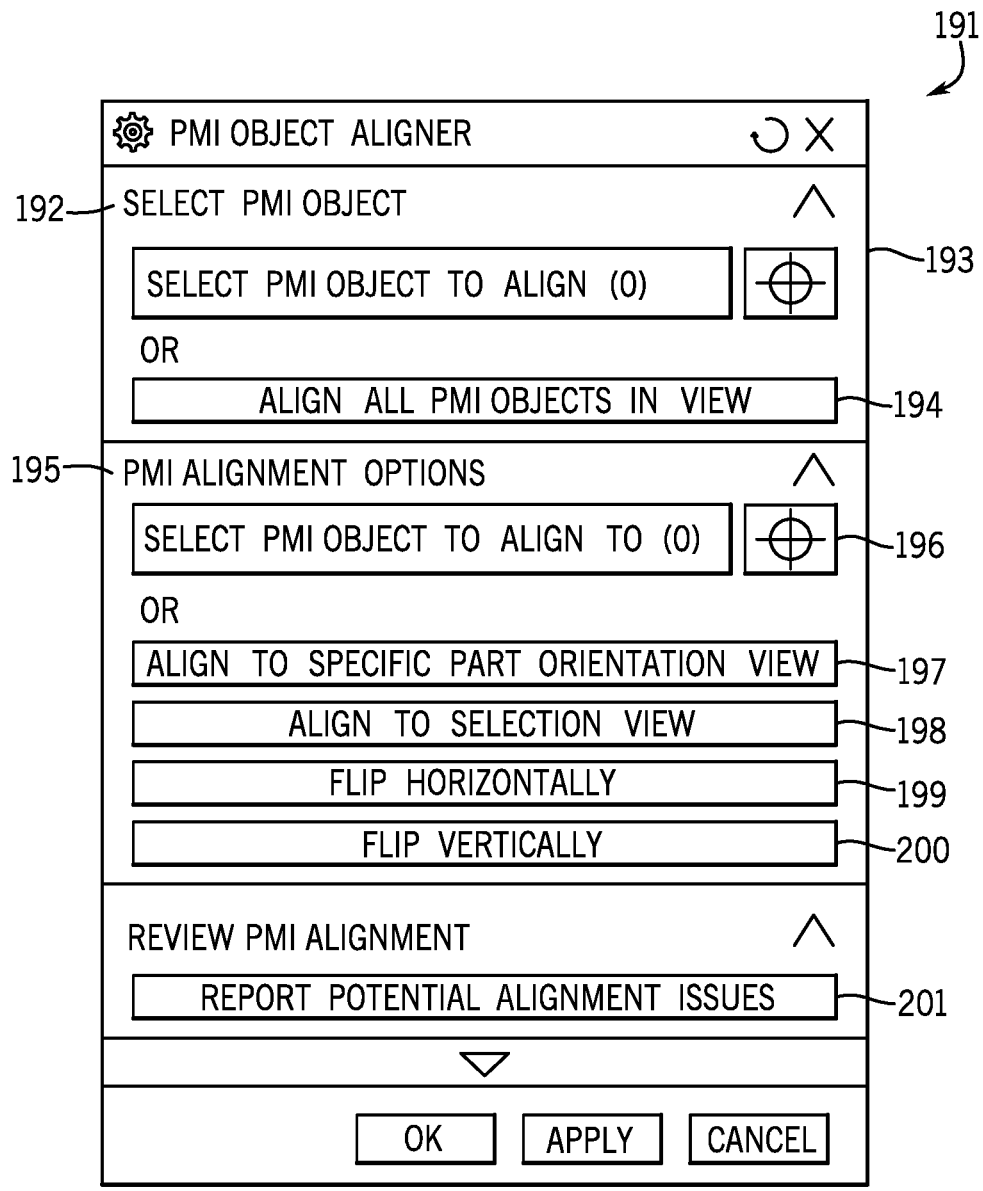
FIG. 10 is a schematic of an embodiment of the CAx system guided user interface for generating alignments for callouts, in accordance with an aspect of the present disclosure.

FIG. 10 is a schematic illustrating an embodiment of the CAx system guided user interface (GUI) 191 for generating alignments for PMI objects 179. The GUI 191 includes a PMI object selection prompt 192, alignment parameters prompt 195, and a prompt 201 for identifying and/or reporting alignment issues.

The PMI object selection prompt 192 includes a first PMI object selection option 193 for manually selecting PMI objects 179 the user may want to align with a desired orientation view for the part. In some embodiments, the PMI objects 179 may be manually selected by a user (e.g., by hovering the arrow over the PMI object 179 and clicking on the PMI object 179). In certain embodiments, the PMI objects 179 selected and displayed as the first selection option 193 may be selected to be adequately aligned. For example, for a part including four PMI objects 179 where only three of the PMI objects 179 are selected via the first PMI selection option 193 and the one PMI object 179 is not selected, the unselected PMI object 179 may not be displayed in the final orientation view. Alternatively, in certain embodiments, the one PMI object 179 not selected may be displayed in the final orientation view, but it may not be aligned with a desired view.

In some embodiments, a second selection option 194 may be used for automatically selecting PMI objects 179, such that all PMI objects 179 may be aligned with a desired orientation view. In some embodiments, the second PMI selection option 194 may select all PMI objects 179 displayed in a view. The PMI objects 179 that may be selected by the second PMI selection option 194 may include the PMI objects 179 visible on the GUI (e.g., display). For example, the PMI objects 179 present on the GUI may be selected to be aligned with a desired view.

After providing PMI objects 179 to the PMI selection prompt 192, the GUI 191 provides PMI alignment options 195. In some embodiments, the PMI objects 179 selected in the PMI selection prompt 192 may be aligned according to the orientation of an existing PMI object (alignment option 196). For example, the PMI objects 179 specified in the PMI selection prompt 192 may be aligned to one specific PMI object 179. In some embodiments, the specific PMI object 179 may or may not be a PMI object specified in the PMI selection prompt 192. After approving of the selections, the PMI objects specified in the PMI selection prompt 192 may be aligned with the specific PMI object (alignment option 196).

Alternatively, the PMI objects 179 specified in the PMI selection prompt 192 may be aligned normal to a specific view of the part. For example, in some embodiments, the PMI objects 179 specified in the PMI selection prompt 192 may be aligned to a specific part orientation view (alignment option 197). The specific part orientation view may be any view of the part such as an isometric view, a rear view, a front view, a side view, a perspective view, and the like. Selecting and confirming that the PMI objects 179 specified in the PMI selection prompt 192 be aligned with the specific part orientation view (alignment option 197) may cause the PMI objects 192 to be oriented normal to a vector associated with the specific part orientation view.

In some embodiments, the PMI objects 179 specified in the PMI selection prompt 192 may be aligned to a section view of the part (alignment option 198). In other embodiments, the PMI objects 179 specified in the PMI selection prompt 192 may be flipped horizontally (alignment option 199) and/or flipped vertically (alignment option 200).

Furthermore, the GUI 191 may allow for a user review of the PMI alignment (e.g., after the final view with the aligned PMI objects 179 has been generated). In some embodiments, the GUI may include a prompt 201 for reporting a potential alignment issue. For example, if some PMI objects 179 are to be aligned normal to a section view of the part (alignment option 198), but a PMI object 179 is aligned incorrectly (e.g., flipped 180 degrees), the user may report the alignment issue to prompt 201.

Figure 11:
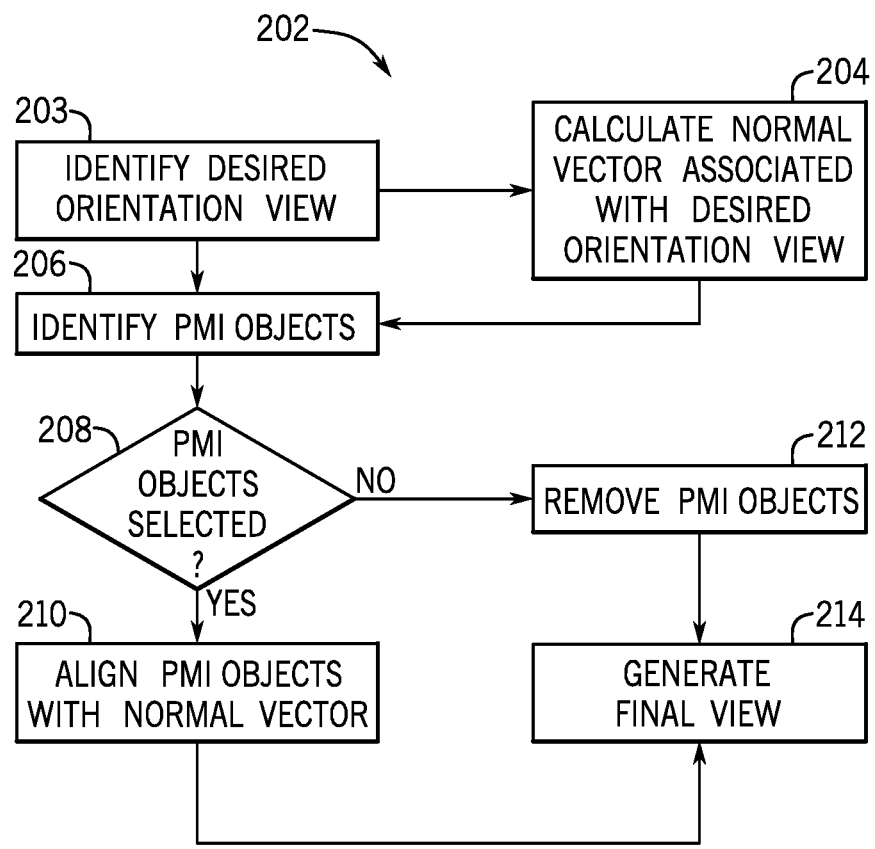
FIG. 11 is a process flow diagram illustrating an embodiment of a method whereby the orientation of the callouts on a model view are aligned, in accordance with an aspect of the present disclosure.

FIG. 11 is a process flow diagram 202 illustrating an embodiment of a method whereby the orientation of the PMI objects 179 on a model are aligned. Process flow diagram 202 proceeds by identifying the desired orientation view (process block 203); calculating the normal vector associated with the desired orientation view (process block 204); identifying the PMI objects 179 (process block 206); determining whether PMI objects 179 are selected (decision block 208); if PMI objects 179 are selected, aligning PMI objects 179 with normal vector (process block 210); if PMI objects 179 are not selected, removing the PMI objects 179 (process block 212); and generating final 3D view (process block 214).

A computer system contains instructions stored on a computer-readable medium that, when executed by a processor, cause the processor to execute the processes of process flow diagram 202. Moreover, the processor identifies the desired orientation view (process block 203) of the model. The processor may receive an indication of the orientation of the part, such that processing the indication of the orientation of the part allows the processor to identify the orientation view of the part displayed on the 3D model. In certain embodiments, the indication may be a specific arrangement of the coordinate system of three orthogonal axes (e.g., an x axis, y axis, and z axis). For example, if a first axis points out of the display, the processor may receive this indication (e.g., the first axis pointing out of the display screen) to identify the desired orientation view to be a front view.

As an additional example, if a second axis points out of the display, the processor may receiving this indication (e.g., the second axis pointing out of the display screen) to identify the desired orientation view to be a right side view. In some embodiments, the processor may identify the desired orientation view based on a selection made on the user interface of the CAD system. For example, a selection for an isometric view may be made on the user interface of the CAD system, thereby causing the model to orient accordingly and the processor may identify the desired orientation view to be an isometric view based at least in part on the selection made via the user interface of the CAD system. As mentioned above, orienting the part may also reorient the PMI objects 179 (e.g., text describing a PMI of a feature of the part) because the PMI objects 179 may be fixed to the normal vector of the original view the PMI objects 179 were generated in. Therefore, moving the part, and inherently the PMI objects 179, may make the PMI objects 179 illegible because the part has become, for example, flipped, inverted, rotated 90 degrees, or any other part manipulation, thereby may cause the PMI objects 179 to become illegible.

After the desired orientation view is identified by the processor, the processor calculates the normal vector associated with the desired orientation view (process block 204) identified by the processor. The normal vector may be the vector (e.g., line) that is perpendicular to the display (e.g., user interface) showing the desired orientation view. For example, in the two dimensional case, the normal vector to a curve at a given point is the line perpendicular to the tangent line to the curve at that point. The display showing the desired orientation view may be substantially flat, such that the normal vector to that substantially flat surface may is the line pointing out of the surface (e.g., or display). It should be noted that when the PMI object 179 is initially generated, it may be aligned with a vector normal (e.g., perpendicular) to the view it is initially generated on. That is the PMI object 179 may be normal to the display when the PMI object 179 is initially generated. When the orientation of the part changes, the vector normal to the plane that the PMI object 179 (e.g., text) is displayed on is no longer aligned to the vector normal to the display (e.g., the PMI object 179 may no longer be aligned on a plane parallel to the display).

As such, calculating the normal vector associated with the desired orientation view (process block 204) may include, for example, determining the cross product of these two vectors (e.g., the vector normal to the display and the vector normal to the plane the PMI object 179 is displayed on) to determine the rotation axis, determining the dot product of the two vectors to determine the rotation angle, building quaternion to determine rotation parameters, and/or any combination thereof. Furthermore, in certain embodiments, calculating the normal vector may include finding the transformation matrix (e.g., or any characteristics indicative of the rotation angle, including those mentioned above) for each respective character of the one or more annotations. In some embodiments, calculating the normal vector associated with the desired orientation view may include rotating the vector normal to the plane the PMI object 179 is displayed on and making it match the vector normal to the display (e.g., the vector pointing out of the user interface, display, screen, etc. Moreover, in certain embodiments, it may be more computationally efficient for the processor to generate any of the aforementioned calculations in spherical coordinates, cylindrical coordinates, Cartesian coordinates, or any combination thereof.

The processor of the CAD system may identify the PMI objects 179 (process block 206) on the model displaying the desired orientation view of the part. In certain embodiments, after the PMI object 179 (e.g., text indicative of PMI of a feature and/or part) is generated on the part, the PMI object 179 and details indicative of the PMI object 179 are stored the computer-readable medium that the processor may retrieve. After being stored, the PMI objects 179 may be automatically identified by the processor. In certain embodiments, the characters (e.g., letters, numbers, symbols, etc.) associated with the PMI object may be identified as PMI objects 179 by the processor. In some embodiments, the PMI objects 179 may be manually identified via the user interface of the CAD system. For example, a user may manually select (e.g., via hovering over the feature associated with the PMI object 179, and clicking on the feature by pushing a button on a mouse) the PMI objects 179. By selecting one of the features associated with a PMI, the PMI objects 179 associated with the features stored in the PMI association may be identified as PMI objects 179. In some embodiments, the PMI objects 179 may be identified automatically, manually, or any combination thereof.

The processor may then determine whether the identified PMI objects 179 on the model are selected as PMI objects 179 (decision block 208). In certain embodiments, any PMI object 179 identified by the processor may also be selected as a PMI object 179. Furthermore, the PMI objects 179 selected by the processor may be manually unselected by the user by sending inputs indicative of unselecting the PMI objects 179 to the user interface. In some embodiments, the processor may select only the PMI objects 179 satisfying a PMI object 179 criteria. The PMI object 179 criteria may include selecting one PMI object 179 if more than a given threshold of PMI objects 179 (e.g., four PMI objects 179) are present per unit area, selecting only PMI objects 179 on a given portion of the part, and/or any other PMI object 179 criteria.

When the part is oriented to a different view, the orientation of the PMI objects 179 may be accordingly oriented (e.g., change point of view), thereby making the PMI objects 179 illegible or difficult to decipher. To enhance the legibility of the PMI object 179, the PMI object 179 may be oriented to be normal with the calculated normal vector. In some embodiments, if a PMI object 179 is selected, the PMI objects 179 are aligned with the normal vector (process block 210). In certain embodiments, aligning the PMI object 179 with the normal vector may include utilizing the parameters calculated when calculating the normal vector (e.g., the cross product, the dot product, the angle of rotation, the quaternion, etc.) to shift and align the PMI object 179 with the calculated normal vector.

Alternatively, if certain PMI objects 179 identified by the processor are not selected, the PMI objects 179 may be removed (process block 212). In certain embodiments, removing the PMI objects 179 includes hiding and/or not displaying the PMI object 179 in the current view (e.g, hide from the current view displaying the model). In some embodiments, if the PMI object 179 is a PMI association relating multiple features to an association type and criteria, as mentioned above, and the PMI object 179 is not selected, the PMI association may not be removed. That is, if a PMI object 179 is not selected (e.g., and therefore aligned with the normal vector), the feature the PMI object 179 belongs to may still be associated to a PMI association. In some embodiments, PMI object 179 may be manually unselected via user inputs to the user interface of the CAD system, such that unselecting the PMI objects 179 may remove the PMI objects 179 from the part view.

After the PMI objects 179 are aligned with the calculated normal vector or removed, based at least in part on whether the PMI objects 179 were selected, a final view of the part is generated (process block 214). The generated final view of the part may contain selected PMI objects 179 aligned to a calculated normal vector, such that the normal vector points outward the display, and the aligned PMI objects 179 may be more legible. In certain embodiments, the PMI objects 179 displayed on the final generated view may be aligned with the calculated normal vector (e.g., aligned normal to the display screen) based at least in part of the fact that the PMI objects 179 that are not selected are removed and therefore not aligned. It should be appreciated that in certain embodiments, the alignment of the PMI objects 179 may be updated in real-time (e.g., while the view of the part changes orientation). That is, despite what orientation the part takes, the model (e.g., view of the part) will always have text aligned with the normal vector, where the normal vector may get calculated anytime the orientation of the part changes.

Figure 12:
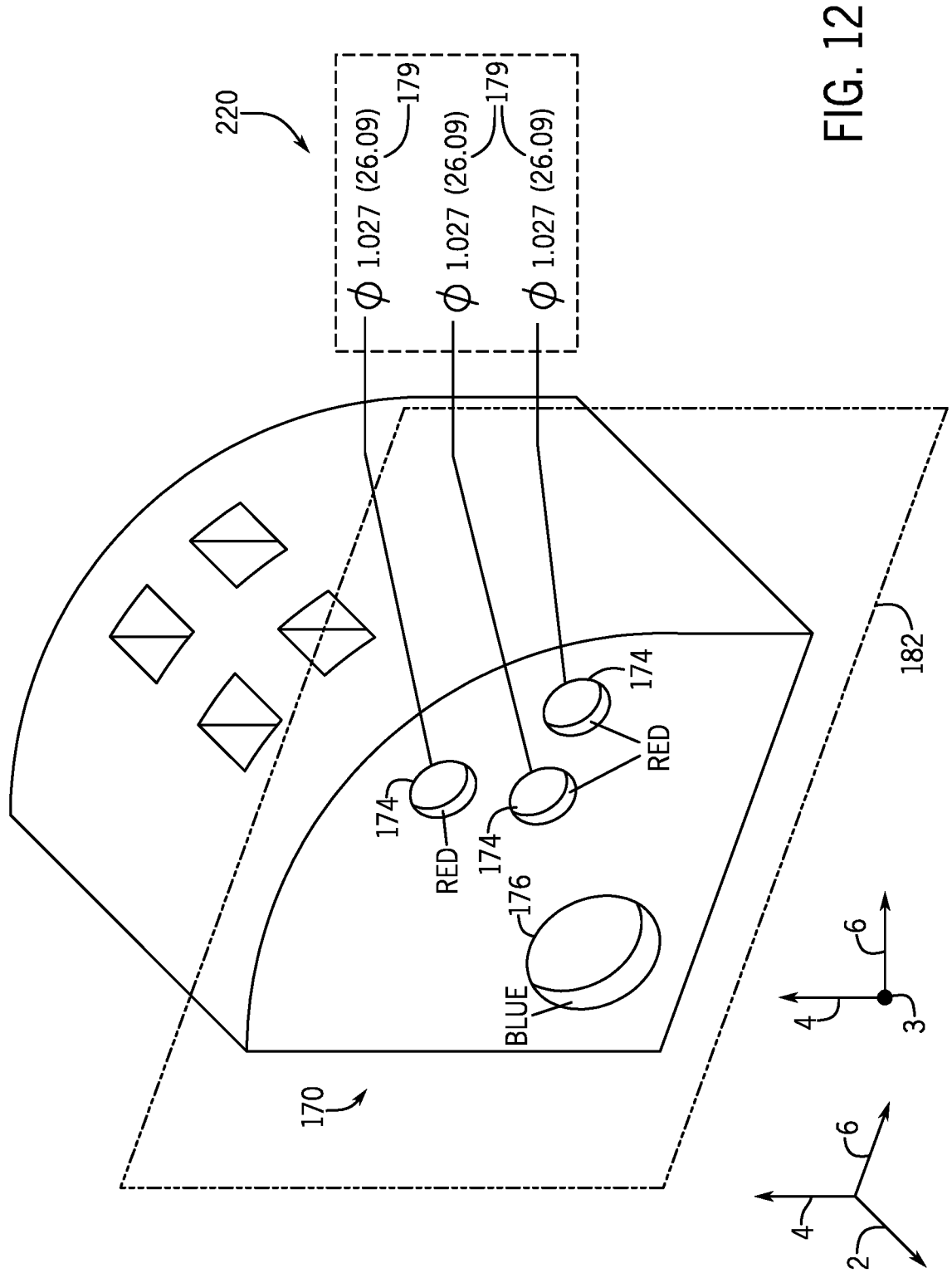
FIG. 12 is the perspective model view of FIG. 9 containing callouts that have been aligned with a calculated normal vector, in accordance with an aspect of the present disclosure.

FIG. 12 is the perspective view of FIG. 9 containing PMI objects 179 that have been aligned with a calculated normal vector, based at least on the process flow diagram 202 of FIG. 11. In other words, the three PMI objects 179 (e.g., including text "ø1.027 (26.09)" indicative of PMI) illustrated on FIG. 9 are aligned with plane 182, which lies on the front face of part 170 and is perpendicular to the forward direction 2 and parallel to the plane formed by the upward direction 4 and the side direction 6. The orientation of the PMI objects 179 changed from the orientation illustrated in FIG. 9 to the orientation illustrated on FIG. 12 based at least in part on the process flow diagram 202 of FIG. 11.

More specifically, a normal vector pointing in direction 3 (e.g., out of the plane spanned by direction 4 and direction 7) may be calculated by the process causing the PMI objects 179 for the holes 174 to be aligned as illustrated by FIG. 12. More specifically, the PMI objects 179 of FIG. 12 lie on plane 220, such that plane 220 is parallel to the plane spanned by direction 4 and direction 7. Therefore, the generated final view includes PMI objects 179 that have been aligned with a normal vector (e.g., vector pointing in direction 3).

While the above-mentioned subject matter is applied to a specific part 170, it should be appreciated that in further embodiments, the subject matter mentioned above may be applied to any shape, having any number of features.

This written description uses examples to disclose the claimed subject matter, including the best mode, and also to enable any person skilled in the art to practice the claimed disclosure, including making and using any devices or systems and performing any incorporated methods. The patentable scope of the claimed disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system comprising:
a processor configured to implement a computer-aided technology (CAx) system; and
memory storing instructions configured to implement the CAx system and to be executed by the processor to cause the processor to:
 present a three-dimensional (3D) computer-aided design (CAD) model on a graphical-user-interface (GUI), the 3D CAD model comprising at least one machine part, the at least one machine part comprising a plurality of features,
  a first feature of the plurality of features being associated with a product and manufacturing information (PMI) object, the PMI object comprising a description indication indicative of PMI associated with the first feature of the plurality of features,
  a second feature of the plurality of features comprising a common PMI that is the same as a PMI of the first feature,
  the GUI comprising a first section to specify an association type, a second section to specify a criteria, and a third section for specifying the PMI;
 in response to receiving at least one indication of the first feature of the plurality of features comprising a first PMI object via the third section, at least one indication of the association type via the first section, and at least one indication of at least one criteria corresponding to the at least one indication of the association type via the second section,
 iterate the 3D CAD model to identify the second feature of the plurality of features of the 3D CAD model according to the association type and the at least one criteria, wherein iterating the 3D CAD model comprises scanning the plurality of features to identify the second feature that meets the at least one criteria for the association type based on the common PMI;
 generate and store a PMI association in response to identifying the second feature, wherein the PMI association links the second feature to the first PMI object; and display a second PMI object of the second feature on the 3D CAD model in the GUI, the second PMI object comprising a second description indication of a second PMI associated with the second feature, wherein the second description indication comprises text that matches text of a first description indication associated with the first feature.

2. The system of claim 1, wherein the at least one indication of the at least one criteria comprises one or more first features of a selected seed object.

3. The system of claim 1, wherein the at least one indication of the at least one criteria comprises an explicit indication of a characteristic without regard to a seed object.

4. The system of claim 1, wherein the 3D CAD model comprises a view comprising two-dimensional (2D) view of the at least one machine part or a 3D view of the at least one machine part, wherein the view is oriented according to a coordinate system of the CAx system.

5. The system of claim 1, wherein the at least one indication of the association type indicates at least one common characteristic shared between the first feature and the second feature.

6. The system of claim 5, wherein the at least one common characteristic comprises a common color.

7. The system of claim 5, wherein the at least one common characteristic comprises a common face that comprises the first feature.

8. The system of claim 5, wherein the at least one common characteristic comprises a common surface area of feature faces.

9. The system of claim 5, wherein the at least one common characteristic comprises at least two of: a common color, a common face that comprises the first feature, and a common surface area of feature faces.

10. The system of claim 1, wherein the instructions are configured to cause the processor to receive, via selection of a pre-existing annotation in the GUI, the description indication indicative of the PMI associated with the first feature of the plurality of features.

11. The system of claim 1, wherein the instructions are configured to cause the processor to receive, via manual entry in a dialog box of the GUI, the description indication indicative of the PMI associated with the first feature of the plurality of features.

12. A computer-implemented method implemented by a computer-aided technology (CAx) system, the computer-implemented method comprising:
presenting a three-dimensional (3D) computer-aided design (CAD) model on a graphical-user-interface (GUI), the 3D CAD model comprising at least one machine part,
the at least one machine part comprising a plurality of features, a first feature of the plurality of features being associated with a product and manufacturing information (PMI) object, the PMI object comprising a description indication indicative of PMI associated with each feature of the plurality of features, a second feature of the plurality of features comprising a common PMI that is the same as a PMI of the first feature, the GUI comprising a first section to specify an association type, a second section to specify a criteria, and a third section for specifying the PMI;
in response to receiving at least one indication of the first feature of the plurality of features comprising a first PMI object via the third section, at least one indication of the association type via the first section, and at least one indication of at least one criteria corresponding to the at least one indication of the association type via the second section,
iterating the 3D CAD model to identify the second feature of the plurality of feature of the 3D CAD model according to the association type and the at least one criteria,
wherein iterating the 3D CAD model comprises scanning the plurality of features to identify the second feature that meets the at least one criteria for the association type by scanning the plurality of features, the association type, and the at least one criteria in 3D CAD model based on the common PMI;
generating and storing a PMI association in response to identifying the second feature, wherein the PMI association links the second feature to the first PMI object; and
displaying a second PMI object of the second feature on the 3D CAD model on the GUI, the second PMI object comprising
a second description indication of a second PMI associated with the second feature, wherein the second description indication comprises text that matches text of a first description indication associated with the first feature.

13. The method of claim 12, wherein receiving the at least one indication of the association type comprises receiving at least one indication of a common characteristic shared between the first feature and the second feature.

14. The method of claim 13, wherein receiving the at least one indication of the common characteristic comprises receiving at least two of: a common color, a common face that comprises the first feature, and a common surface area of feature faces.

15. A tangible, non-transitory, computer-readable medium, comprising computer-readable instructions that, when executed by one or more processors of a computer, are configured to implement a computer-aided technology (CAx) system and cause the one or more processors to:
present a three-dimensional (3D) computer-aided design (CAD) model on a graphical-user-interface (GUI), the 3D CAD model comprising at least one machine part,
the at least one machine part comprising a plurality of features, a first feature of the plurality of features being associated with a product and manufacturing information (PMI) object, the PMI object comprising a description indication indicative of PMI associated with the first feature of the plurality of features, a second feature of the plurality of features comprising a common PMI that is the same as a PMI of the first feature, the GUI comprising a first section to specify an association type, a second section to specify a criteria, a third section for specifying the PMI;
in response to receiving at least one indication of the first features of the plurality of features comprising a first PMI object via the third section, at least one indication of the association type via the first section, and at least one indication of at least one criteria corresponding to the at least one indication of the association type via the second section,
iterate the 3D CAD model to identify the second feature of the plurality of features according to the association type and the at least one criteria based on the common PMI, wherein iterating the 3D CAD model comprises scanning the plurality of features to identify the second feature that meets the at least one criteria for the association type by scanning the plurality of features, the association type, and the at least one criteria in the 3D CAD model based on the common PMI;

generate and store a PMI association in response to identifying the second feature, wherein the PMI association links the second feature to the first PMI object; and display a PMI object of the second feature on the 3D CAD model on the GUI, the second PMI object comprising a second description indication of a second PMI associated with the second feature, wherein the second description indication comprises text that matches text of a first description indication associated with the first feature.

16. The tangible, non-transitory, and computer-readable medium of claim 15, wherein the at least one indication of the association type indicates at least one common characteristic type shared between the first feature and the second feature.

17. The tangible, non-transitory, and computer-readable medium of claim 16, wherein the at least one common characteristic comprises an indication of a common color.

18. The tangible, non-transitory, and computer-readable medium of claim 16, wherein the at least one common characteristic comprises an indication of a common face that comprises the first feature.

19. The tangible, non-transitory, and computer-readable medium of claim 16, wherein the at least one common characteristic comprises an indication of a common surface area of feature faces.

20. The tangible, non-transitory, and computer-readable medium of claim 15, wherein the instructions are configured to cause the one or more processors to receive, via selection of a pre-existing annotation in the GUI, the description indication indicative of the PMI associated with the at first feature of the plurality of features.

* * * * *